(12) United States Patent
Jo et al.

(10) Patent No.: US 6,780,784 B2
(45) Date of Patent: Aug. 24, 2004

(54) ETCHANT AND ARRAY SUBSTRATE HAVING COPPER LINES ETCHED BY THE ETCHANT

(75) Inventors: Gyoo-Chul Jo, Gyeonggi-do (KR); Ki-Sung Chae, Gyeonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 4 days.

(21) Appl. No.: 10/015,650

(22) Filed: Dec. 17, 2001

(65) Prior Publication Data

US 2002/0081847 A1 Jun. 27, 2002

(30) Foreign Application Priority Data

Dec. 20, 2000 (KR) .................................. 2000-79355

(51) Int. Cl.[7] .......................................... H01L 21/302
(52) U.S. Cl. ........................ 438/745; 438/754; 216/13
(58) Field of Search ................. 438/745, 754; 216/13

(56) References Cited

U.S. PATENT DOCUMENTS

| | | | | |
|---|---|---|---|---|
| 4,140,772 A | * | 2/1979 | Korenowski | 423/272 |
| 4,220,706 A | | 9/1980 | Spak | 430/318 |
| 4,306,933 A | | 12/1981 | Da Fonte, Jr. | 156/644 |
| 4,401,509 A | | 8/1983 | Schellinger, Jr. | 156/666 |
| 4,462,861 A | * | 7/1984 | McClean | 216/13 |
| 5,248,386 A | | 9/1993 | Dastolfo, Jr. et al. | 156/659.1 |
| 5,800,726 A | | 9/1998 | Cotte et al. | 216/108 |
| 6,126,755 A | | 10/2000 | Colgan et al. | 134/3 |
| 6,130,443 A | * | 10/2000 | Hong et al. | 257/59 |
| 6,133,581 A | * | 10/2000 | Terao et al. | 257/40 |
| 6,218,281 B1 | * | 4/2001 | Watanabe et al. | 438/612 |
| 6,515,726 B2 | * | 2/2003 | Chae et al. | 349/139 |

FOREIGN PATENT DOCUMENTS

| | | |
|---|---|---|
| DE | 41 00 839 | 7/1992 |
| EP | 0 890 660 | 1/1999 |
| JP | 8-199376 | 8/1996 |
| RU | 1458430 | 2/1989 |
| WO | 91/05079 | 4/1991 |
| WO | 01/68930 | 9/2001 |

OTHER PUBLICATIONS

United Kingdom Patent Office Combined Search and Examinstion Report, GB 0130263.7, Mar. 13, 2002.

* cited by examiner

Primary Examiner—Kin-Chan Chen
(74) Attorney, Agent, or Firm—Morgan, Lewis & Bockius LLP

(57) ABSTRACT

A method of forming an array substrate for use in a thin film transistor liquid crystal display (TFT-LCD) device includes forming a first metal layer on a substrate, patterning the first metal layer to form a gate line and a gate electrode extended from the gale line, forming a gate insulation layer on the substrate to cover the patterned first metal layer, forming an active layer on the gate insulation layer and over the gate electrode, forming an ohmic contact layer on the active layer, forming a second metal layer on the gate insulation layer to rover the ohmic contact layer and the active layer, forming a third copper metal layer on the second metal layer, simultaneously patterning the second metal layer and the third copper metal layer to form a double-layered data line, a double-layered source electrode and a double-layered drain electrode using an etchant that includes hydrogen peroxide ($H_2O_2$), a $H_2O_2$ stabilizer, and a neutral salt, and forming a pixel electrode contacting the double-layered drain electrode.

7 Claims, 4 Drawing Sheets

| Metal | Resistivity($\mu\Omega\cdot cm$) | Price | Adhesive Strength | Heat Resistance |
|---|---|---|---|---|
| Cu | 2 | Low | Bad | Good |
| Au | 3 | High | Bad | Good |
| Al | 4 | Low | Good | Bad |
| Mo | 10 | Middle | Good | Good |
| Cr | 25 | Middle | Good | Good |

ETCHANT AND ARRAY SUBSTRATE HAVING COPPER LINES ETCHED BY THE ETCHANT

The present invention claims the benefit of Korean Patent Application No. 2000-79355, filed in Korea on Dec. 20, 2000, which is hereby incorporated by reference.

BACKGROUND OF THE INVENTION

1. Field of the Invention

The present invention relates to an array substrate for use in electronic equipment. More particularly it relates to an etchant and an etching method for liquid crystal display devices having copper (Cu) lines.

2. Discussion of the Related Art

Metal lines in electronic equipment generally serve to apply signals to electronic elements. The metal lines contribute to production costs and stability of the electronic equipment. Accordingly, a material to form the metal lines needs to be inexpensive, have a low electrical resistance, and a high corrosion resistance.

Array substrates are commonly used in liquid crystal display (LCD) devices. The performance characteristics and operational properties of the array substrates are partially determined by the material with which individual elements of the array substrates are formed. For example, gate and data lines of the array substrate have significant influence on the performance characteristics and operational properties of the array substrate. Although resistivity of the materials used to form the gate and data lines is relatively insignificant in small-sized LCD devices, the resistivity of the gate and data lines in large-sized LCD devices, especially over 18 inches, determines picture quality. Therefore, in large LCD devices having high resolution, materials with which to form the gate and data lines includes Aluminum (Al) or Al-alloy because of their low electrical resistance.

However, pure aluminum is chemically weak when exposed to acidic processing, and may result in formation of hillocks on surfaces of the gate line and gate electrode during high temperature processing. Furthermore, the occurrence of hillocks may cause extraordinary growth of gate insulation layer formed on the gate line and gate electrode. Thus, the gate insulation layer may be destroyed, and an electrical short circuit may occur between the gate electrode and an active layer that is formed on the gate insulation layer. Accordingly, thin film transistor (TFTs) having gate lines and gate electrodes formed from pure aluminum do not adequately function as switching devices.

To overcome these problems, aluminum alloys such as aluminum neodymium (AlNd) are used for the gate line and gate electrode. In addition, a multi-layered aluminum structure is used for the gate line and the gate electrode. Specifically, the aluminum (Al) layer is stacked with a molybdenum (Mo) layer having a high corrosion resistance and durability. However, if the multi-layered aluminum structure is used for the gate line, additional manufacturing processes are required. Therefore, copper (Cu), which is cheap and has low electrical resistance, is proposed to be used as the gate line, thereby decreasing a total number of manufacturing processes.

FIG. 1 is a schematic partial plan view illustrating an array substrate for use in a liquid crystal display device according to the related art, and FIG. 2 is a cross-sectional view taken along II—II of FIG. 1. In FIGS. 1 and 2, an array substrate 10 includes a pixel region "P" having a corresponding thin film transistor (TFT) "T" and a pixel electrode 42. Gate lines 13 are arranged in a transverse direction and data lines 15 are arranged in a longitudinal direction such that each pair of the gate lines 13 and the data lines 15 define a pixel region "P". The TFT "T" includes a gate electrode 32, a source electrode 34, a drain electrode 36, and a semiconductor layer 38. The gate electrode 32 of the TFT "T" extends from the gate line 13, while the source electrode 34 of the TFT "T" extends from the data line 15. A gate insulation layer 24 is formed on the substrate 10 to cover the gate electrode 32 and gate line 13. The drain electrode 36 is spaced apart from the source electrode 34, and the semiconductor layer 38 is disposed on the gate insulation layer 24, especially over the gate electrode 32. The semiconductor layer 38 is divided into an active layer 38a, and an ohmic contact layer 38b. The active layer 38a is made of pure amorphous silicon, while the ohmic contact layer 38b is made of impurity-included amorphous silicon. Since the ohmic contact layer 38b is attached to the source electrode 34 and drain electrode 36, the ohmic contact layer 38b decreases the contact resistance between the active layer 38a, and the source 34 and drain 36 electrodes. The source electrode 34 and the drain electrode 36 overlap opposite ends of the gate electrode 32. A passivation layer 39 is disposed on a whole surface of the substrate 10 to protect the TFT "T" and data line 15. The passivation layer 39 has a drain contact hole 40 over the drain electrode 36 such that a portion of the pixel electrode 42 overlaps a portion of the drain electrode 36, and electrically contacts the drain electrode 36 through the drain contact hole 40.

Within the structure and configuration of the active matrix liquid crystal display (AM-LCD) device described in FIGS. 1 and 2, aluminum (Al) is usually used for the gate line 13 to reduce RC-delay.

FIG. 3 is a table showing characteristics of the metal that can be used for lines in electronic equipment according to the related art. Among the metallic materials shown in FIG. 3, aluminum (Al) or chromium (Cr) is used for the metal lines in a conventional array substrate. However, although aluminum (Al) has a low electrical resistance and superior adhesive strength, aluminum is susceptible to damage from exposure to heat and acid. Therefore, it is proposed that copper (Cu), which has a low resistance and low cost, be utilized as the metal lines in the array substrate.

When forming the gate line using copper (Cu), ammonium persulfate $((NH_4)_2S_2O_8)$ is generally used as an etchant to etch the Cu layer to form the Cu gate line. However, forming the data line using copper (Cu) is problematic. First, when forming the data line using copper (Cu), the source and drain electrodes are also made of copper (Cu). However, a silicon component of a corresponding semiconductor layer reacts with the Cu component of the source and drain electrodes, thereby forming an intermediate layer between the Cu source and drain electrodes and the semiconductor silicon layer. The intermediate layer has a negative influence on the electrical characteristics of the corresponding thin film transistor (TFT).

Second, if another metal such titanium (Ti) or molybdenum (Mo) is disposed between the Cu layer and the semiconductor layer to overcome the above-mentioned problem, the etchant must simultaneously etch the two metal layers (Cu—Ti or Cu—Mo). To etch the double-layered metal layers (Cu—Ti or Cu—Mo), it is widely known that hydrogen fluoride (HF) or oxygen-based etching solution is generally used as an etchant. However, the HF etchant etches not only the double-layered metal layers but also the glass substrate and the insulation layer that is made of silicon nitride ($SiN_x$) or silicon oxide ($SiO_x$). As a result, the HF etchant creates significant damage to the insulation layer, thereby compromising performance characteristics of the gate line and the gate electrode that are protected by the insulation layer. Accordingly, it is very difficult to form the data line, the source electrode, and the drain electrode from copper (Cu).

SUMMARY OF THE INVENTION

Accordingly, the present invention is directed to an etchant and an array substrate having copper lines etched by the etchant that substantially obviates one or more of the problems due to limitations and disadvantages of the related art.

An object of the present invention is to provide an etchant which simultaneously etches a double-layered metal layer.

Another object of the present invention is to provide a method of forming an array substrate having copper lines and electrodes.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the etchant and array substrate having copper lines etched by the etchant includes an etchant including hydrogen peroxide ($H_2O_2$), and a mixed solution including at least one of an organic acid, an inorganic acid, and a neutral salt.

In another aspect, a method of forming an array substrate for use in a thin film transistor liquid crystal display (TFT-LCD) device includes forming a first metal layer on a substrate, patterning the first metal layer to form a gate line and a gate electrode extended from the gate line, forming a gate insulation layer on the substrate to cover the patterned first metal layer, forming an active layer on the gate insulation layer and over the gate electrode, forming an ohmic contact layer on the active layer, forming a second metal layer on the gate insulation layer to cover the ohmic contact layer and the active layer, forming a third metal layer on the second metal layer, simultaneously patterning the second metal layer and the third metal layer to form a double-layered data line, a double-layered source electrode and a double-layered drain electrode using an etchant that includes hydrogen peroxide ($H_2O_2$), a $H_2O_2$ stabilizer, and at least one of an organic acid, an inorganic acid and a neutral salt, and forming a pixel electrode contacting the double-layered drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate the present invention and together with the description serve to explain the principles of that invention. In the drawings.

DETAILED DESCRIPTION OF THE PREFERRED EMBODIMENTS

Figure 1:
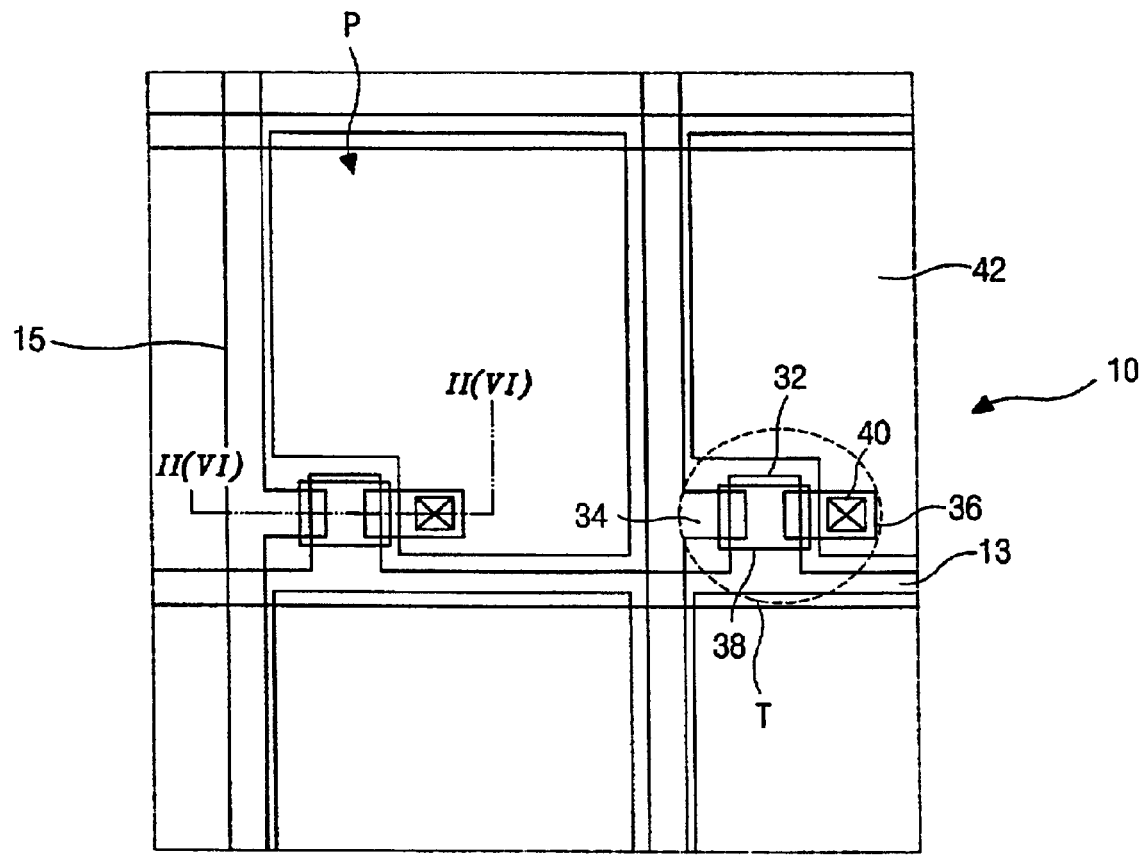
FIG. 1 is a schematic partial plan view illustrating an array substrate for use in a liquid crystal display device according to the related art.
Figures 2, 3:
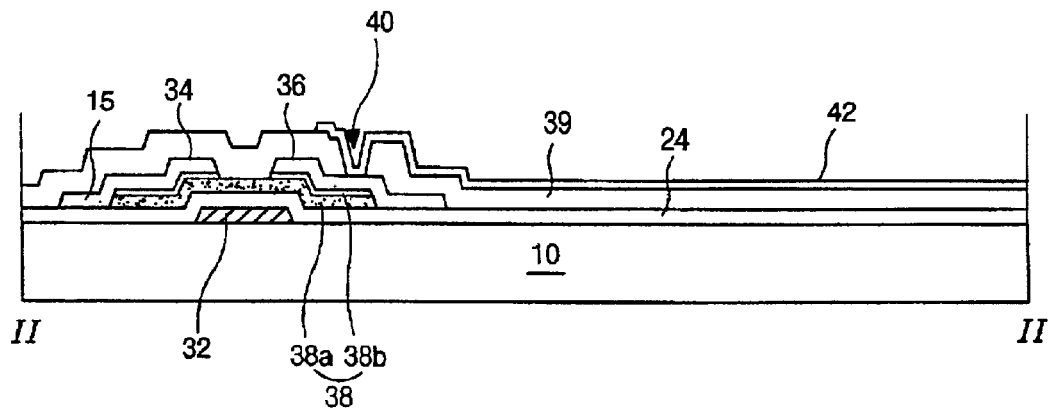
FIG. 2 is a cross-sectional view taken along II—II of FIG. 1 according to the related art.
FIG. 3 is a table showing characteristics of the metal used for conductive lines in electronic equipment according to the related art.

Reference will now be made in detail to the preferred embodiments of the present invention, examples of which are illustrated in the accompanying drawings. Wherever possible, the same reference numbers will be used throughout the drawings to refer to similar parts.

In the present invention, data lines of an array substrate, and source and drain electrodes of a thin film transistor may be formed of a copper-molybdenum (Cu—Mo) double-layer, for example. Further, an etchant that will be explained hereinafter may etch the Cu—Mo double-layer according to the present invention.

In the present invention, the etchant may be a mixed solution of hydrogen peroxide ($H_2O_2$), a $H_2O_2$ stabilizer, and one of an organic acid, an inorganic acid and a neutral salt, and may simultaneously etch the Cu—Mo double-layer. The reaction mechanism of Mo and $H_2O_2$ of the etchant is as follows:

$$Mo+3H_2O_2=MoO_3+3H_2O \quad (1)$$

As a result of equation (1), $MoO_3$ may be produced. However, since $MoO_3$ easily dissolves in water ($H_2O$), producing $MoO_3$ may not be problematic. Therefore, etching the Mo layer may be performed. Alternatively, the Mo layer may be etched only using hydrogen peroxide ($H_2O_2$).

Meanwhile, a reaction mechanism of Cu and $H_2O_2$ of the etchant may be presented by the following equation:

$$Cu+H_2O_2=CuO+H_2O \quad (2)$$

In equation (2), although a copper compound CuO may be generated, the reaction product (i.e., oxidized copper (CuO)) may react with anions of the organic acid, the inorganic acid, or the neutral salt that are included in the etchant. Therefore, the copper compound CuO and $H_2O$ may be formed by the etchant according to the present invention. Furthermore, the oxidized metal or metal ion may be produced.

In order to etch the Cu layer, $H_2O_2$ and one of the organic acid, the inorganic acid, and the neutral salt may be required. Accordingly, when etching the metal layers, the etchant needs the $H_2O_2$ stabilizer to prevent self-decomposition of $H_2O_2$.

In the present invention, a first etchant including the organic acid such as an acetic acid ($CH_3COOH$), for example, $H_2O_2$, and the $H_2O_2$ stabilizer reacts with copper (Cu) as follows:

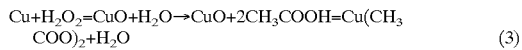

$$Cu+H_2O_2=CuO+H_2O \rightarrow CuO+2CH_3COOH=Cu(CH_3COO)_2+H_2O \quad (3)$$

Furthermore, when the inorganic acid is included in the etchant according to the present invention, a second etchant may include $H_2O_2$, the $H_2O_2$ stabilizer, and one of sulfuric acid ($H_2SO_4$), nitric acid ($HNO_3$), hydrochloric acid (HCl), and phosphoric acid ($H_3PO_4$). Therefore, the second etchant may react with copper (Cu) as follows.

In a case when the second etchant may include sulfuric acid ($H_2SO_4$):

  (4)

In a case when the second etchant may include nitric acid ($HNO_3$):

  (5)

In a case when the second etchant may include hydrochloric acid (HCl):

  (6)

In a case when the second etchant may include phosphoric acid ($H_3PO_4$):

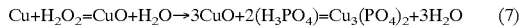  (7)

Moreover, when the neutral salt is included in the etchant according to the present invention, a third etchant may include $H_2O_2$, the $H_2O_2$ stabilizer, and one of potassium chloride (KCl), sodium chloride (NaCl), potassium hydrogen sulfate ($KHSO_4$), and potassium metaperiodate ($KIO_4$). Therefore, the third etchant having potassium hydrogen sulfate ($KHSO_4$), for example, reacts with copper (Cu) as represented by the following equation:

  (8)

As previously described, the etchant according to the present invention may be classified into first, second and third etchants depending on their individual components. Therefore, the etchant of the present invention may include at least one of the organic acid, the inorganic acid, and the neutral salt. Furthermore, when the etchant includes the inorganic acid, two or three of the inorganic acids may be mixed with the etchant. Two or three of the neutral salts may also be mixed into the etchant when the neutral salt is included in the etchant.

Figure 4:
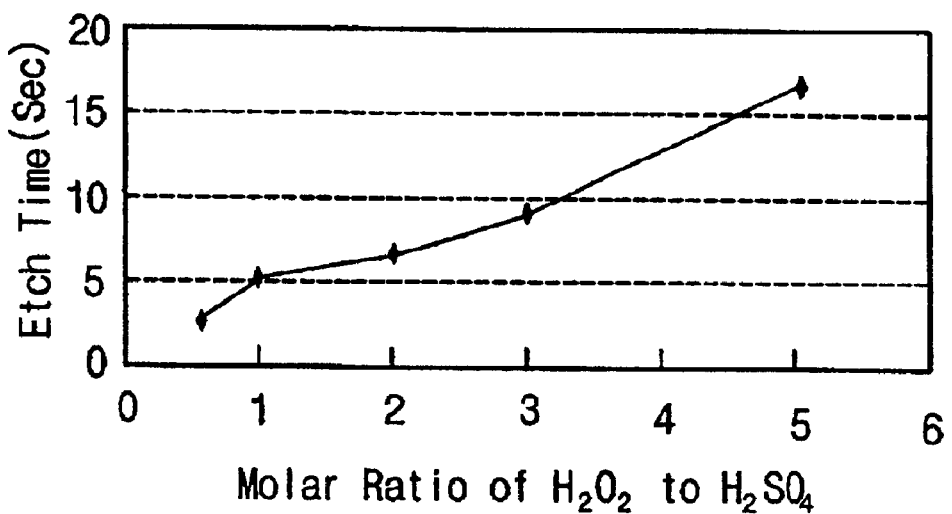
FIG. 4 is a graph showing an exemplary relationship between etch times of copper layers and molar ratios of hydrogen peroxide ($H_2O_2$) to sulfuric acid ($H_2SO_4$) according to the present invention.
Figure 5:
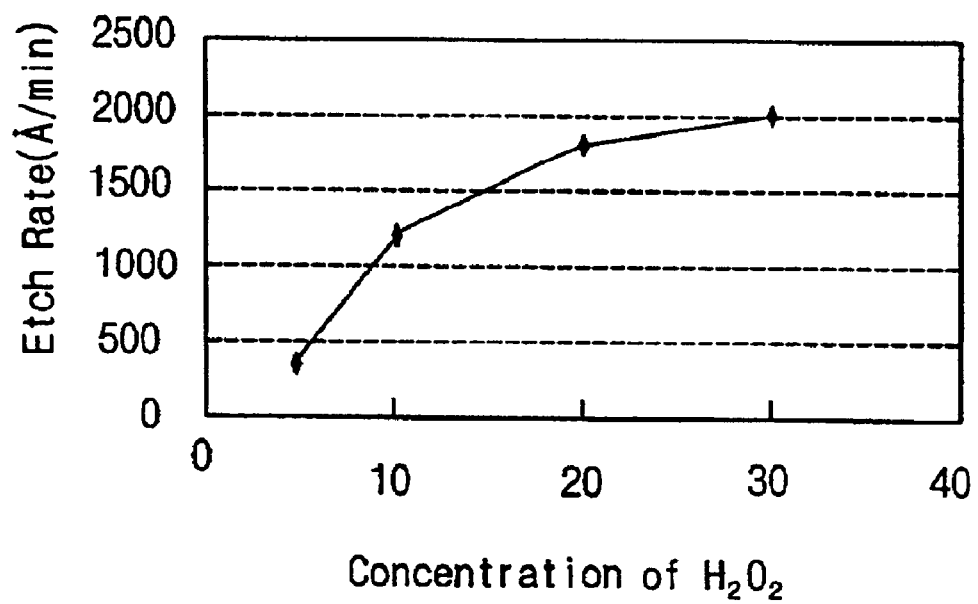
FIG. 5 is a graph showing another exemplary relationship between etch rates and concentration of hydrogen peroxide ($H_2O_2$) according to the present invention.

FIG. 4 is a graph showing an exemplary relationship between an etch time of copper (Cu) layers and molar ratios of hydrogen peroxide ($H_2O_2$) to sulfuric acid ($H_2SO_4$) according to the present invention, and FIG. 5 is a graph showing another exemplary relationship between etch rates and concentration of hydrogen peroxide ($H_2O_2$).

In FIG. 4, a Cu layer has a thickness of about 1,000 angstroms (Å) and a sulfuric acid ($H_2SO_4$) has a weight percent of about 5 wt %. As shown in FIG. 4, as a molar quantity of hydrogen peroxide ($H_2O_2$) increases, the etch time of the Cu layer increases. Specifically, as the molar amount of hydrogen peroxide ($H_2O_2$) in the etchant increases, production of oxidized copper (CuO) is increased. Therefore, it takes a longer amount of time for oxidized copper (CuO) to react with the sulfate acid ($H_2SO_4$).

In FIG. 5, as a concentration of hydrogen peroxide ($H_2O_2$) increases, the etch rate of molybdenum (Mo) increases. However, the etch rate of Mo appears continuous after a certain concentration amount of $H_2O_2$ is attained. Accordingly, an etchant that simultaneously etches both the Cu layer and the Mo layer can be obtained when the amount of hydrogen peroxide ($H_2O_2$) is controlled at a certain value. Additionally, since molybdenum oxide ($MoO_3$) dissolves in water ($H_2O$), the etch rate does not vary although the organic acid, inorganic acid and neutral salt are added in the etchant. Moreover, the etchant and a method of using the etchant can be utilized in other electronic equipment having Cu layers.

Figure 6A:
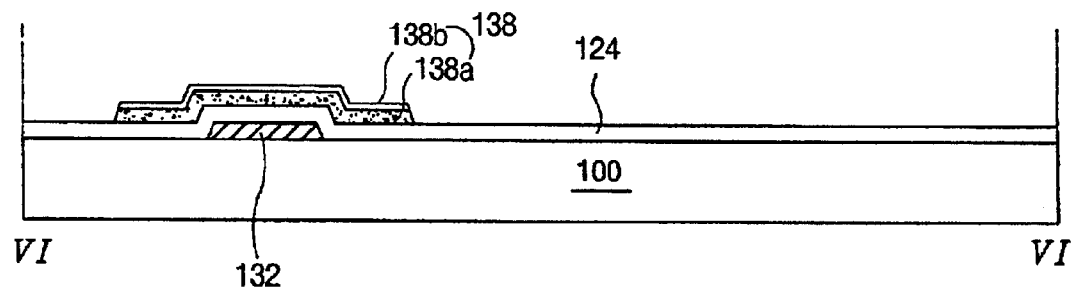
FIGS. 6A to 6C are cross-sectional views taken along VI—VI of FIG. 1 to illustrate an exemplary manufacturing process according to the present invention.
Figure 6B:
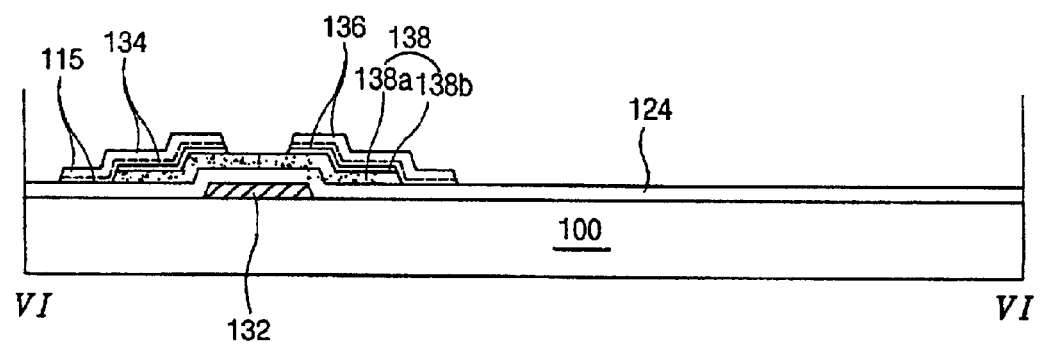
Figure 6C:
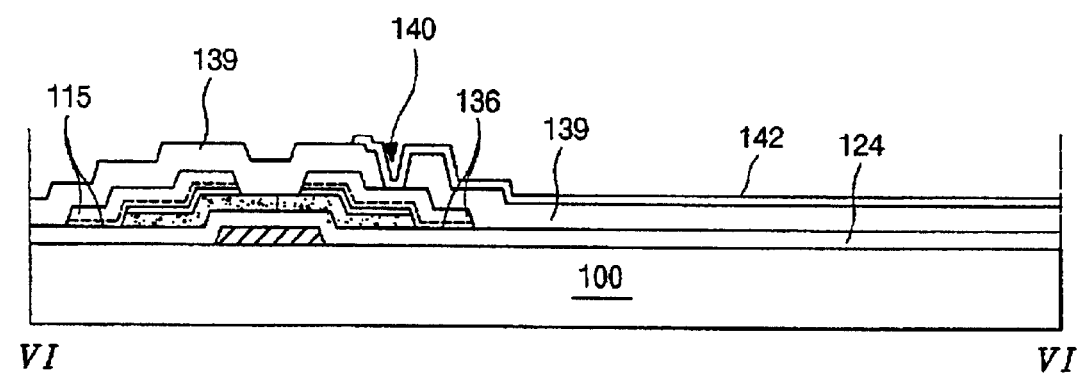

FIGS. 6A to 6C are cross-sectional views taken along VI—VI of FIG. 1 to illustrate an exemplary manufacturing process according to the present invention.

In FIG. 6A, a first metal layer may be deposited on a substrate 100, and subsequently patterned to form a plurality of gate lines (13 of FIG. 1) and a plurality of gate electrodes 132. The first metal layer may include aluminum (Al), aluminum alloy such as aluminum neodymium (AlNd), chromium (Cr), tungsten (W), molybdenum (Mo) or copper (Cu), for example. The plurality of gate lines may be arranged in a transverse direction, and each gate electrode 132 extends from each gate line on the substrate 100. Thereafter, a gate insulation layer 124 may be formed on a surface of the substrate 100 to cover the patterned first metal layer. The gate insulation layer 124 may include an inorganic material, such as silicon oxide ($SiO_x$) or silicon nitride ($SiN_x$), for example, or an organic material, such as benzocyclobutene (BCB) or an acryl-base resin, for example. After forming the gate insulation layer 124 on the substrate 100 to cover the patterned first metal layer, an active layer 138a that may include a pure amorphous silicon (a-Si:H) and an ohmic contact layer 138b that may include a doped amorphous silicon ($n^+$ a-Si:H) may be sequentially formed upon the gate insulation layer 124, especially over the gate electrode 132. Thus, a semiconductor layer 138 includes the active layer 138a, and ohmic contact layer 138b. The active layer 138a may function as an active channel when the thin film transistor is enabled. The ohmic contact layer 138b may reduce a contact resistance between the active layer 138a and electrodes formed in a later step.

In FIG. 6B, a second metal layer may be formed upon an entire surface of the gate insulation layer 124, thereby covering the active layer 138a and ohmic contact layer 138b. Then, a third metal layer may be sequentially formed on the second metal layer. The second metal layer may include molybdenum (Mo), for example, and the third metal layer may include copper (Cu) or copper alloy, for example. The second metal layer may prevent the third metal layer from chemically reacting with silicon components of the semiconductor layer 138. If the third metal layer reacts with the semiconductor layer 138, an intermediate layer will be produced between the third metal and the semiconductor layer, thereby deteriorating operational characteristics of the thin film transistor.

Further in FIG. 6B, the second and third metal layers may be simultaneously patterned using the previously described etchant. Specifically, after synthesizing $H_2O_2$, the $H_2O_2$ stabilizer, and one of the organic acid, the inorganic acid and the neutral acid, the etchant simultaneously etches and patterns the double metal layer (Mo—Cu layer) to form a double-layered data line 115, a double-layered source electrode 134, and a double-layered drain electrode 130. The double-layered data line 115 may be arranged perpendicular to the gate line (13 of FIG. 1) to define a pixel region "P" (FIG. 1) with the double-layered data line 115. The double-layered source electrode 134 may extend from the double-layered data line 115, and the double-layered drain electrode 136 may be spaced apart from the double-layered source electrode 134. The double-layered source electrode 134 and the double-layered drain electrode 136 may overlap opposite end portions of the gate electrode 132, respectively. Furthermore, a portion of the ohmic contact layer 138b disposed upon the active layer 138a may be etched using the source electrode 134 and drain electrode 136 as masks, thereby forming a channel region in the active layer 138b between the source electrode 134 and the drain electrode 136.

In FIG. 6C, a passivation layer 139 may be formed on the TFT "T" and on the gate insulation layer 124. The passivation layer 139 may include an inorganic material, such as silicon oxide ($SiO_x$) or silicon nitride ($SiN_x$), for example, or an organic material, such as benzocyclobutene (BCB) or an acryl-base resin, for example. Thereafter, the passivation layer 139 may be patterned to form a drain contact hole 140 to expose a portion of the double-layered drain electrode 136. Next, a transparent conductive material may be deposited on the patterned passivation layer 139. The transparent conductive material may include indium tin oxide (ITO) or indium zinc oxide (IZO), for example. Thereafter, the transparent conductive material may be patterned to form a pixel electrode 142 in the pixel region "P." A portion of the pixel electrode 142 may overlap a portion of the drain electrode 136 and electrically contact the drain electrode 136 through the drain contact hole 140. Although the method described only uses the Mo—Cu layer as a data line, a source electrode and a drain electrode, the Mo—Cu layer can be utilized in the gate line and gate electrode.

It will be apparent to those skilled in the art that various modifications and variations can be made in the etchant and array substrate having copper lines etched by the etchant without departing from the spirit or scope of the invention. Thus, it is intended that the present invention cover the modifications and variations of this invention provided they come within the scope of the appended claims and their equivalents.

What is claimed is:

1. A method of forming an array substrate for use in a thin film transistor liquid crystal display (TFT-LCD) device, comprising:

forming a first metal layer on a substrate;

patterning the first metal layer to form a gate line and a gate electrode extended from the gate line;

forming a gate insulation layer on the substrate to cover the patterned first metal layer;

forming an active layer on the gate insulation layer and over the gate electrode;

forming an ohmic contact layer on the active layer;

forming a second metal layer on the gate insulation layer to cover the ohmic contact layer and the active layer;

forming a third copper metal layer on the second metal layer;

simultaneously patterning the second metal layer and the third copper metal layer to form a double-layered data line, a double-layered source electrode and a double-layered drain electrode using an etchant that includes hydrogen peroxide ($H_2O_2$), a $H_2O_2$ stabilizer, and a neutral salt; and forming a pixel electrode contacting the double-layered drain electrode.

2. The method according to claim 1, wherein the first metal includes copper.

3. The method according to claim 1, wherein the second metal includes molybdenum.

4. The method according to claim 1, wherein the third copper metal layer includes copper alloy.

5. The method according to claim 1, wherein the double-layered data line, double-layered source electrode and double-layered drain electrode include a copper (Cu) layer and a molybdenum (Mo) layer.

6. The method according to claim 1, wherein the double-layered data line, double-layered source electrode and double-layered drain electrode include a copper (Cu) alloy layer and molybdenum (Mo) layer.

7. The method according to claim 1, wherein the neutral salt is selected from the group consisting of potassium chloride (KCl), sodium chloride (NaCl), potassium hydrogen sulfate ($KHSO_4$), and potassium metaperiodate ($KIO_4$).

* * * * *